(12) United States Patent
Miyamoto et al.

(10) Patent No.: US 9,281,105 B2
(45) Date of Patent: Mar. 8, 2016

(54) PERMANENT MAGNET AND METHOD OF PRODUCING PERMANENT MAGNET

(75) Inventors: Noritaka Miyamoto, Toyota (JP); Shinya Omura, Aichi-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 140 days.

(21) Appl. No.: 13/808,612

(22) PCT Filed: Jul. 13, 2011

(86) PCT No.: PCT/IB2011/001636
§ 371 (c)(1),
(2), (4) Date: Jan. 7, 2013

(87) PCT Pub. No.: WO2012/007828
PCT Pub. Date: Jan. 19, 2012

(65) Prior Publication Data
US 2013/0135069 A1    May 30, 2013

(30) Foreign Application Priority Data

Jul. 14, 2010 (JP) .................................. 2010-159696
Jul. 8, 2011 (JP) .................................. 2011-151740

(51) Int. Cl.
| | |
|---|---|
| *H01F 7/02* | (2006.01) |
| *H01F 1/01* | (2006.01) |
| *H01F 41/00* | (2006.01) |
| *H01F 41/02* | (2006.01) |
| *H01F 1/057* | (2006.01) |

(52) U.S. Cl.
CPC ................ *H01F 1/01* (2013.01); *H01F 41/005* (2013.01); *H01F 41/0293* (2013.01); *H01F 1/0577* (2013.01)

(58) Field of Classification Search
CPC ............ B22F 2207/01; C22C 2202/02; H01F 1/0577; H01F 41/0293; H01F 1/09; H01F 1/053; H01F 1/0572; H01F 41/005; H01F 1/01
USPC ........................... 335/302; 148/105, 300–302
See application file for complete search history.

(56) References Cited

U.S. PATENT DOCUMENTS

| | | |
|---|---|---|
| 2002/0062884 A1 | 5/2002 | Kaneko et al. |
| 2004/0187963 A1 | 9/2004 | Tayu et al. |

(Continued)

FOREIGN PATENT DOCUMENTS

| | | |
|---|---|---|
| CN | 1347123 | 5/2002 |
| EP | 1 195 779 A | 4/2002 |

(Continued)

OTHER PUBLICATIONS

Written Opinion of the International Searching Authority in International Application No. PCT/IB2011/001636; Mailing Date: Nov. 30, 2011.

(Continued)

*Primary Examiner* — Bernard Rojas
(74) *Attorney, Agent, or Firm* — Finnegan, Henderson, Farabow, Garrett & Dunner, LLP

(57) ABSTRACT

A permanent magnet has a grain structure that includes a main phase and a grain boundary phase that is primarily composed of a first metal. A second metal that enhances the coercivity of the permanent magnet and a third metal that has a lower standard free energy of oxide formation than the first metal and the second metal are diffused in the permanent magnet, and the third metal is present in the form of an oxide in the grain boundary phase.

5 Claims, 6 Drawing Sheets

(56) References Cited

U.S. PATENT DOCUMENTS

| | | |
|---|---|---|
| 2005/0284545 A1 | 12/2005 | Komuro et al. |
| 2007/0034299 A1 | 2/2007 | Machida et al. |
| 2009/0200885 A1 | 8/2009 | Kikuchi et al. |
| 2010/0231338 A1* | 9/2010 | Morimoto et al. ............ 335/302 |
| 2011/0012699 A1* | 1/2011 | Odaka et al. ................. 335/302 |
| 2011/0095855 A1* | 4/2011 | Kuniyoshi et al. ........... 335/302 |
| 2014/0184370 A1* | 7/2014 | Hidaka et al. ................ 335/302 |

FOREIGN PATENT DOCUMENTS

| | | |
|---|---|---|
| JP | 2002-190404 | 7/2002 |
| JP | 2003-293008 | 10/2003 |
| JP | 2005-11973 | 1/2005 |
| JP | 2007-258455 | 10/2007 |
| JP | 2010-114200 | 5/2010 |

OTHER PUBLICATIONS

Applicant's Response to the Written Opinion of the International Searching Authority in International Application No. PCT/IB2011/001636 (May 9, 2012).

Written Opinion of the International Preliminary Examining Authority in International Application No. PCT/IB2011/001636; Mailing Date: Jul. 13, 2012.

Applicant's Response to the Written Opinion of the International Preliminary Examining Authority in International Application No. PCT/IB2011/001636 (Sep. 13, 2012).

* cited by examiner

PERMANENT MAGNET AND METHOD OF PRODUCING PERMANENT MAGNET

CROSS-REFERENCE TO RELATED APPLICATIONS

This application is a national phase application of International Application No. PCT/IB2011/001636, filed Jul. 13, 2011, and claims the priority of Japanese Application Nos. 2010-159696, filed Jul. 14, 2010, and 2011-151740, filed Jul. 8, 2011, the content of all of which is incorporated herein by reference.

BACKGROUND OF THE INVENTION

1. Field of the Invention

The present invention relates to a permanent magnet and a method of producing the permanent magnet.

2. Description of Related Art

Among motors including brushless DC motor, a motor that is provided with a permanent magnet embedded rotor that has a rotor core and a plurality of permanent magnets that are embedded in the rotor core (which is hereinafter referred to as "IPM motor") is well known. For example, the IPM motor is used as a driving motor for hybrid vehicles.

Making further reference to the permanent magnet that is used in actuators for motors or the like, neodymium magnets (also known as Nd—Fe—B sintered permanent magnets (such as $Nd_2Fe_{14}B$)) are finding wide application because of their excellent magnetic characteristics, and are used in vehicles including hybrid vehicles, which can be said to lead the current automobile industry; industrial machines; and wind power generators, which are attracting attention as clean energy sources.

Residual magnetization (residual magnetic flux density) and coercivity are often used as indices of magnet performance. For Nd—Fe—B sintered permanent magnets, the residual magnetization may be increased by increasing the volume fraction or improving the degree of crystal orientation, and the coercivity can be increased by refining the crystal grain size, using an alloy that has a high Nd concentration, or adding grains of a metal that has high coercivity.

The method that is most commonly used to improve the coercivity is to increase the anisotropic magnetic field of the metal compound by substituting a portion of Nd in an Nd—Fe—B alloy with a metal that has high coercivity, such as dysprosium (Dy) or terbium (Tb), in order to enhance the coercivity.

However, the amount of use of dysprosium or terbium as described above significantly exceeds the natural abundance ratio of rare-earth elements. In addition, because the estimated reserves in commercially developed ore deposits are very small and because the ore deposits are unevenly distributed around the world, the necessity of element strategy has been recognized. It is known that the abundance ratio of terbium is significantly smaller than that of dysprosium.

As described above, the coercivity of a permanent magnet may be improved by substituting some Nd with dysprosium or terbium, whereas it is known that the presence of the substitute causes a decrease in the saturation polarization of the permanent magnet. Thus, when the coercivity of a permanent magnet is increased by using dysprosium, a considerable decrease in its residual magnetic flux density should be allowed. In addition, because dysprosium and terbium are rare metals, it is needless to say that it is necessary to reduce the amount of use of dysprosium or terbium as much as possible from the viewpoint of resource risk and material cost.

The reason why dysprosium or the like that is diffused into grain boundaries of grain boundary phases cannot sufficiently diffuse into the deep interior of the grain boundary phases is described with reference to flow diagrams of FIGS. 9A to 9C that use a metallic structure diagram to show a conventional method of producing a permanent magnet.

As shown in FIG. 9A, in the internal structure of an Nd—Fe—B sintered permanent magnet that is composed of a main phase S and a grain boundary phase R, an Nd oxide OX1, such as $Nd_2O_3$ or $NdO_x$, is present at triple points where three regions of the grain boundary phases R meet. When a layer of particles of a metal, such as dysprosium or terbium, is formed over the surfaces of the permanent magnet and a heat treatment is subsequently carried out, the metal diffuses along grain boundaries of the grain boundary phase R as shown in FIG. 9B (X direction).

If the dysprosium or the like that diffuses along the grain boundaries reaches the Nd oxide OX1 present at the triple points where regions of the grain boundary phase R meet, the dysprosium substitutes for the Nd in the oxide because dysprosium has a lower standard free energy of oxide formation than Nd and therefore combines more readily with oxygen than Nd. As a result, as shown in FIG. 9C, the Nd is expelled from the oxide and surrounds the oxide, whereas the dysprosium binds with oxygen to form a dysprosium oxide OX2 and cannot easily diffuse into the deep interior of the permanent magnet. To diffuse dysprosium into the deep interior, it is necessary to use a large amount of dysprosium, resulting in an increase in the material cost.

Japanese Patent Application Publication No. 2002-190404 (JP-A-2002-190404) describes a method for improving the magnetization by preliminarily introducing yttrium (Y), scandium (Sc) or lanthanum (La), which bonds more readily with oxygen than Nd, into the main phase of a magnet so that these metals can be expelled into the grain boundary phase to combine with oxygen during sintering in order to reduce the amount of Nd, which will be combined with and fixed by oxygen. Accordingly, 2000 ppm or more of oxygen is required in order to expel a larger amount of yttrium into the grain boundary phase.

When yttrium or the like is preliminarily present in the main phase of the permanent magnet described in JP-A-2002-190404, the magnetizing of the magnet may be greatly impaired if the yttrium or the like is not fully expelled from the main phase. In addition, because the coercivity of a permanent magnet may be improved by reducing the concentration of oxygen as much as possible and because some currently commercially available permanent magnets are produced in an atmosphere with an oxygen concentration of approximately 1000 ppm or lower, it is not preferred to produce a permanent magnet at an oxygen concentration of 2000 ppm.

SUMMARY OF THE INVENTION

The present invention provides a permanent magnet in which metal grains that improve the coercivity of the permanent magnet are effectively diffused in the grain boundaries in the deep interior thereof and a method of producing the permanent magnet.

A first aspect of the present invention provides a permanent magnet that has a grain structure that includes a main phase and a grain boundary phase which is primarily composed of a first metal. A second metal that enhances the coercivity of the permanent magnet and a third metal that has a lower standard free energy of oxide formation than the first metal and the second metal are diffused in the permanent magnet, and the third metal is present in the form of an oxide in the grain boundary phase.

In the first aspect of the present invention, because a third metal that has a lower standard free energy of oxide formation than a first metal of which the grain boundary phase is primarily composed and a second metal that enhances the coercivity of the permanent magnet is diffused in the permanent magnet, the third metal forms an oxide in the grain boundary phase and allows the second metal to diffuse into the deep interior of the grain boundary phase without forming an oxide. Therefore, the permanent magnet has excellent coercivity.

In contrast to the permanent magnet that is described in JP-A-2002-190404 above, the permanent magnet according to the present invention is not made of a sintered magnet that has a main phase which is composed of a metal that corresponds to the third metal. Thus, the third metal is not present in the main phase of the permanent magnet according to the present invention. Therefore, the permanent magnet according to the present invention also has better magnetizing properties than the permanent magnet described in JPA-2002-190404.

The term "standard free energy of oxide formation" that is used herein means the energy that is required to split the oxide into the metal and oxygen and is an index that indicates how stably the oxide can exist after being forms as an oxide. The more negative (i.e., the smaller) the value is, the more stable the oxide is.

The permanent magnet according to the present invention can be applied to a rare-earth magnet, such as a three-component neodymium magnet (Nd—Fe—B sintered permanent magnet) that is composed of neodymium, iron and boron. The rare-earth magnet is suitable for use in a driving motors for a hybrid vehicle which is required to produce high output power because the rare-earth magnet has a higher maximum energy product $(BH)_{max}$ than ferrite magnet and alnico magnet.

In the embodiment of the permanent magnet in which the first metal is neodymium (neodymium magnet), the second metal may be either dysprosium or terbium, and the third metal may be either yttrium or scandium.

Yttrium and scandium have a lower standard free energy of oxide formation than neodymium, dysprosium and terbium. Therefore, when yttrium, for example, is diffused into the grain boundary phase, it substitutes for the neodymium oxide as the main component of the grain boundary phase (forms a complete solid solution and mixes with the neodymium oxide) and fixes oxygen. In addition, yttrium extensively forms an eutectic with iron and diffuses into grain boundaries. On the other hand, yttrium is less likely to enter the main phase from the grain boundary phase and therefore does not deteriorate the magnetizing properties.

Because the yttrium or the like fixes oxygen, when dysprosium or the like is diffused into grain boundaries, it is not fixed by oxygen and diffused along the grain boundaries into the deep interior of the grain boundary phase. Then, with the lapse of time, neodymium in main phase regions adjacent to the grain boundary phase at each depth from the surface layer to the deep interior of the permanent magnet is substituted by dysprosium or the like and a phase that has a strong anisotropic magnetic field is formed, whereby the magnetocrystalline anisotropy is enhanced and the coercivity of the permanent magnet is improved.

The permanent magnet according to the present invention that is described above is a permanent magnet with high coercivity and good magnetizing properties which can be produced with an extremely small amount of dysprosium or the like compared to conventional permanent magnets, in other words, with extremely low material cost compared to conventional permanent magnets.

In the embodiment of the permanent magnet in which the first metal is neodymium, holmium may be used as the second metal and the third metal.

A second aspect of the present invention provides a permanent magnet that has a grain structure that includes a main phase and a grain boundary phase which is primarily composed of a first metal. The permanent magnet includes a second metal that enhances the coercivity of the permanent magnet and a third metal that has a lower standard free energy of oxide formation than the first metal and the second metal. Both densities of the second metal and the third metal are richer in the grain boundary phase than in the main phase, and the third metal is present in the form of an oxide in the grain boundary phase.

A third aspect of the present invention relates to a method of producing a permanent magnet. The method includes: preparing a sintered magnet that has a metallic structure that comprises a main phase and a grain boundary phase which is primarily composed of a first metal; and diffusing a third metal that has a lower standard free energy of oxide formation than the first metal, and a second metal that has a higher standard free energy of oxide formation than the third metal and that enhances the coercivity of the permanent magnet, into the grain boundary phase.

The method of producing a permanent magnet may include: a first step of preparing a sintered magnet that has a metallic structure that comprises a main phase and a grain boundary phase which is primarily composed of a first metal and diffusing a third metal that has a lower standard free energy of oxide formation than the first metal, into grain boundaries of the grain boundary phase to obtain an intermediate; and a second step of diffusing a second metal that has a higher standard free energy of oxide formation than the third metal and enhances the coercivity of the permanent magnet into the grain boundaries to produce a permanent magnet.

In the above production method, examples of the method for diffusing the third metal into the grain boundary phase of the sintered magnet include a method that includes forming a layer of yttrium or the like as the third metal over the surfaces of a sintered magnet that is composed of neodymium, for example, by sputtering or the like and subsequently carrying out a heat treatment. By this first step, an intermediate in which yttrium or the like has diffused into the grain boundaries to form an oxide in the grain boundary phase is produced.

By forming a layer of dysprosium or the like as the second metal over the surfaces of the intermediate by sputtering or the like and subsequently carrying out a heat treatment in the same manner as in the first step, a permanent magnet in which dysprosium or the like has diffused into the deep interior of the grain boundary phase can be produced (second step).

The present inventors have proved that a permanent magnet that has higher coercivity and better magnetizing properties can be obtained when dysprosium or the like is diffused by applying vaporized dysprosium or the like to the surfaces of the intermediate in the second step instead of forming a layer of dysprosium or the like by sputtering or the like and subsequently carrying out a heat treatment.

The method of producing a permanent magnet may include: forming a layer of yttrium or the like as a third metal over the surface of a sintered magnet that is composed of neodymium by sputtering or the like; forming a layer of dysprosium or the like as a second metal on the layer of yttrium; and heating the sintered magnet to diffuse the yttrium or the like and the dysprosium or the like into the grain boundary phase simultaneously.

The method of producing a permanent magnet may include: depositing a layer of an alloy of yttrium or the like as a third metal and dysprosium or the like as a second metal over the surfaces of a sintered magnet by sputtering or the like; and carrying out a heat treatment to diffuse the alloy into the grain boundary phase.

The concentration of oxygen in the permanent magnet may be 0.2% by mass or smaller.

By the production methods according to the third aspect of the present invention, a third metal which has a lower standard free energy of oxide formation than the main metal (first metal) of which the grain boundary phase is composed and the metal (second metal) that enhances the coercivity of the permanent magnet is diffused into the grain boundary phase in the sintered magnet and fixes oxygen, whereby the second metal that is diffused into the grain boundaries is prevented from being fixed by oxygen. Thus, the second metal diffuses into the deep interior of the grain boundary phase and substitutes the metal (such as neodymium) of which the main phase is composed in regions adjacent to the grain boundary phase regions to improve the magnetocrystalline anisotropy. Therefore, a permanent magnet which has high coercivity and good magnetizing properties can be produced with low production costs compared to the production method of a permanent magnet that has a structure according to the related art.

As can be understood from the above description, according to the permanent magnet and the production method of the permanent magnet according to the present invention, because yttrium or the like, which has a lower standard free energy of oxide formation than dysprosium or the like, which enhances the coercivity of the permanent magnet, and neodymium, which is the main metal of which the grain boundary phase is composed, is diffused into the grain boundary phase and forms an oxide in the grain boundary phase, dysprosium or the like can be diffused into the grain boundaries even if the amount of dysprosium or the like is as small as possible. Therefore, neodymium or the like in main phase regions adjacent to the grain boundary phase regions at each depth from the surface layer to the deep interior of the permanent magnet is substituted by dysprosium or the like and a phase that has a strong anisotropic magnetic field is formed, whereby the magnetocrystalline anisotropy is enhanced. As a result, the material cost in producing a permanent magnet which has high coercivity and good magnetizing properties may be reduced.

A fourth aspect of the present invention relates to a hybrid vehicle that is equipped with a driving motor that includes a permanent magnet produced using the method according to the third aspect of the present invention.

According to the fourth aspect of the present invention, the output power of a hybrid vehicle is increased and the production costs of the hybrid vehicle are reduced.

BRIEF DESCRIPTION OF THE DRAWINGS

Features, advantages, and technical and industrial significance of example embodiments of the invention will be described below with reference to the accompanying drawings, in which like numerals denote like elements, and wherein.

DETAILED DESCRIPTION OF EMBODIMENTS

A permanent magnet and a method of producing of the permanent magnet according to the present invention will be described below with reference to the drawings. It should be noted that the illustrated permanent magnet is a neodymium magnet but the permanent magnet of the present invention is also directed to any type of permanent magnet that has at least a main phase and a grain boundary phase as its structural components, such as samarium-cobalt magnet, samarium-iron-nitrogen magnet and praseodymium magnet.

Figure 1A:
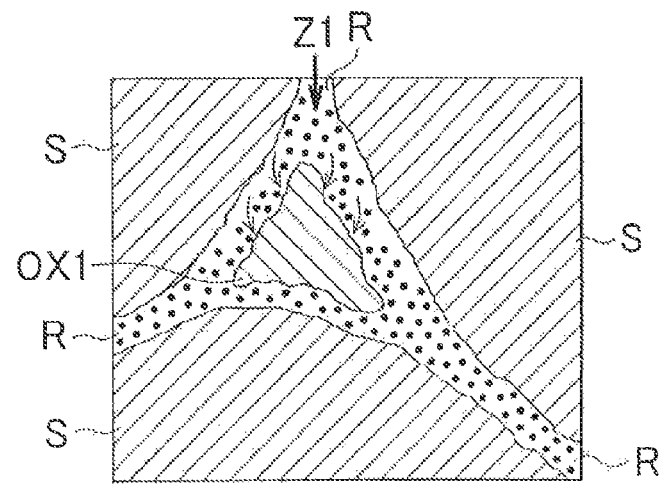
FIGS. 1A to 1C are grain structure diagrams that sequentially illustrate the method of producing of a permanent magnet according to the present invention.
Figure 1B:
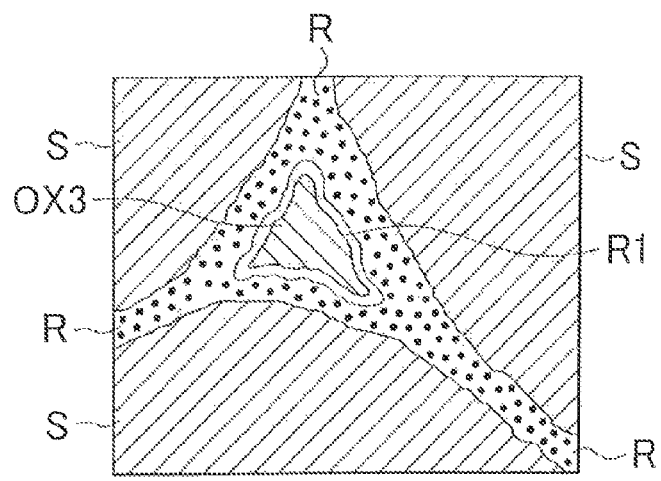
Figure 1C:
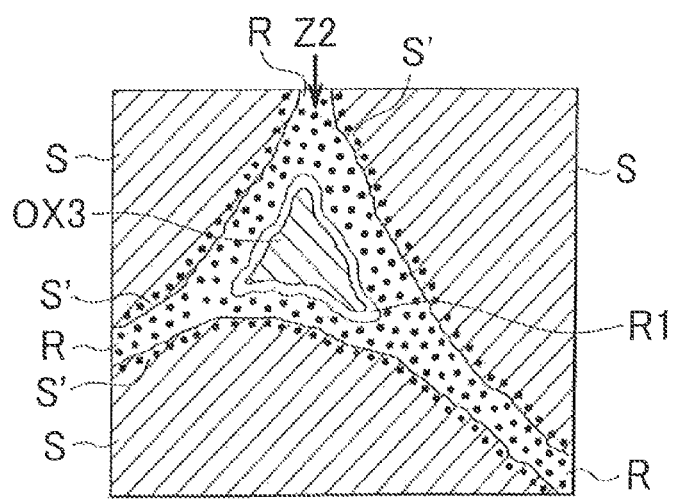

FIGS. 1A to 1C are grain structure diagrams that sequentially illustrate one embodiment of the method of producing a permanent magnet according to the present invention. Each of FIGS. 2 to 5 is a flow chart that shows an embodiment of the method of producing a permanent magnet according to the present invention.

The magnet shown in FIGS. 1A to 1C is an Nd—Fe—B sintered permanent magnet that is composed of a grain boundary phase R that contains neodymium as its main metal and a main phase S that is primarily composed of neodymium, iron and boron.

As shown in FIG. 1A, a neodymium oxide OX1, such as $Nd_2O_3$ or $NdO_x$, is present at triple points where any three regions of the grain boundary phase R, which is primarily composed of neodymium, meet.

A layer of yttrium or scandium is formed over the surfaces of the sintered magnet and a heat treatment is subsequently carried out to diffuse the yttrium or the like into the grain boundaries of the grain boundary phase R (Z1 direction) as shown in FIG. 1A.

For example, when yttrium is diffused into the grain boundaries and contacts the neodymium oxide OX1 at the triple points, the yttrium substitutes for the Nd oxide OX1 and fixes oxygen to form a yttrium oxide OX3 such as $Y_2O_3$ or $YO_x$ as shown in FIG. 1B because yttrium has a lower standard free energy of oxide formation than neodymium, and the expelled neodymium surrounds the yttrium oxide OX3 (neodymium layer R1).

The yttrium also extensively forms a eutectic composition with iron and diffuses into the grain boundaries but is unlikely to enter the main phase S from, the grain boundary phase R and therefore does not deteriorate the magnetizing properties of the sintered magnet.

After the formation of yttrium oxide OX3 in the grain boundary phase R, dysprosium or terbium, which enhances the coercivity of the magnet, diffuses into the grain boundaries from the surfaces of the sintered magnet as shown in FIG. 1C (Z2 direction).

The dysprosium or terbium, which has a higher standard free energy of oxide formation than yttrium, does not substitute for the yttrium oxide OX3 when it reaches the yttrium oxide OX3 by the grain boundary diffusion but may diffuse deeper into the interior along the grain boundaries.

Then, neodymium present in the main phase regions adjacent to the grain boundary phase regions at each depth from the surfaces to the deep interior of the sintered magnet to which dysprosium has been diffused is substituted by the dysprosium or the like, whereby the permanent magnet of the present invention is produced. The main phase substituted phase S' of the resulting permanent magnet has a strong anisotropic magnetic field.

Here, methods for producing the permanent magnet according to the present invention are outlined with reference to the flow charts of FIGS. 2 to 5.

Figure 2:
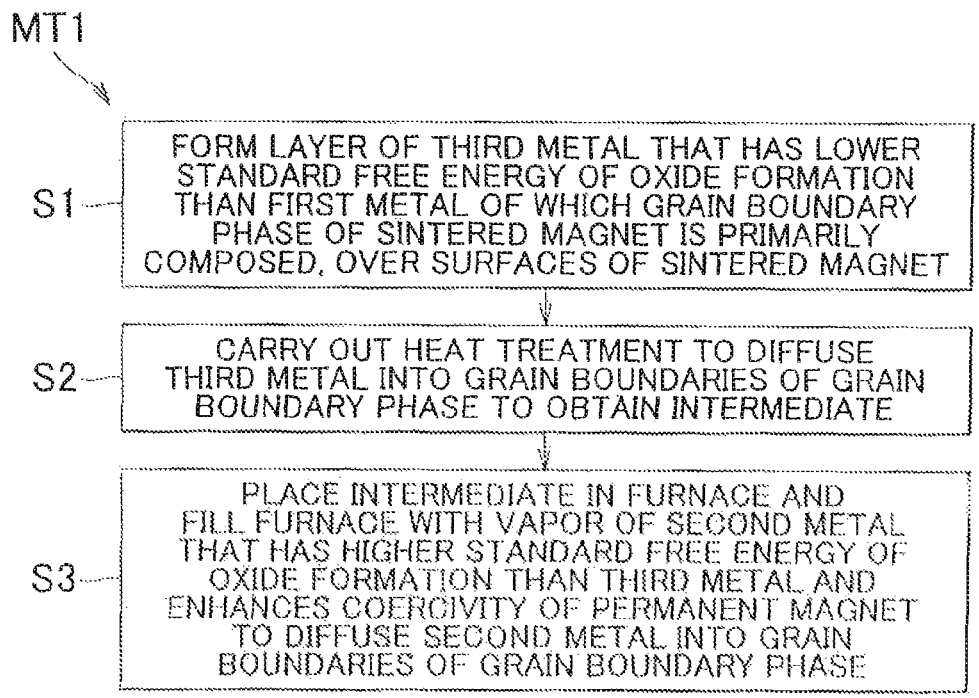
FIG. 2 is a flow chart of one embodiment of a method of producing a permanent magnet according to the present invention.

First, in the production method MT1, shown in FIG. 2, a layer of yttrium (third metal), which has a lower standard free energy of oxide formation than neodymium (first metal) as the main metal of the grain boundary phase of the neodymium sintered magnet is deposited over the surfaces of a neodymium sintered magnet (step S1).

Next, a heat treatment is performed on the sintered magnet to diffuse the yttrium into the grain boundaries of the grain boundary phases to obtain an intermediate (step S2).

In the intermediate, the yttrium displaces the neodymium oxide that was present in the grain boundary phase to form a yttrium oxide and neodymium has been expelled to the regions around the yttrium oxide.

Next, the intermediate is placed in a furnace, and the furnace is filled with vaporized dysprosium (second metal), which has a higher standard free energy of oxide formation than yttrium and enhances the coercivity of the permanent magnet, whereby dysprosium diffuses into the grain boundaries of the grain boundary phase in the intermediate (step S3).

The dysprosium that diffuses into the grain boundaries does not displace the yttrium oxide. Instead, the dysprosium diffuses into the deep interior of the permanent magnet and displaces neodymium in regions of the near the grain boundary phase regions to form a main phase substituted phase that has a strong anisotropic magnetic field.

Because the penetration of dysprosium into the main phase may be reduced and the percentage of dysprosium that penetrates into the grain boundary phase may be increased by diffusing vaporized dysprosium into the grain boundaries from the surfaces of the intermediate, as described in step S3, in comparison to methods in which a layer of dysprosium is deposited over the surfaces of the intermediate by sputtering or the like and then heated to diffuse the dysprosium along the grain boundaries, it is possible to enhance the coercivity effectively using a minimal amount of dysprosium.

Figure 3:
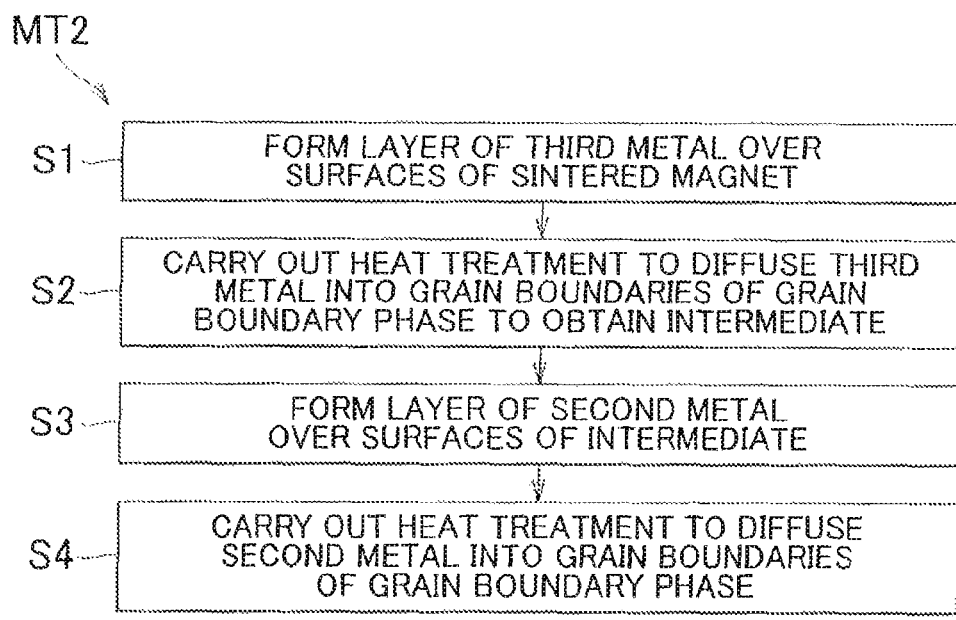
FIG. 3 is a flow chart of another embodiment of the method of producing a permanent magnet according to the present invention.

The production method MT2, shown in FIG. 3, includes depositing a layer of yttrium (third metal) over the surfaces of a neodymium sintered magnet (step S1), performing a heat treatment to diffuse the yttrium into the grain boundaries of the grain boundary phase to obtain an intermediate (step S2), depositing a layer of dysprosium (second metal) over the surfaces of the intermediate (step S3), and performing a heat treatment to diffuse the dysprosium into the grain boundaries (step S4).

Figure 4:
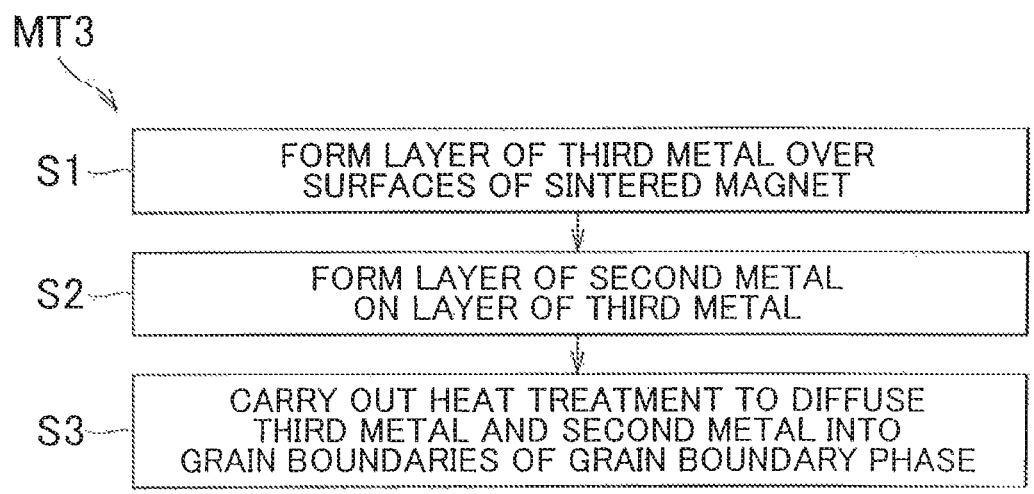
FIG. 4 is a flow chart of yet another embodiment of the method of producing a permanent magnet according to the present invention.

The production method MT3, shown in FIG. 4, includes depositing a layer of yttrium (third metal) over the surfaces of a neodymium sintered magnet (step S1), depositing a layer of dysprosium (second metal) on the layer of yttrium (step S2), and performing a heat treatment to diffuse the yttrium and dysprosium into the grain boundaries simultaneously.

Figure 5:
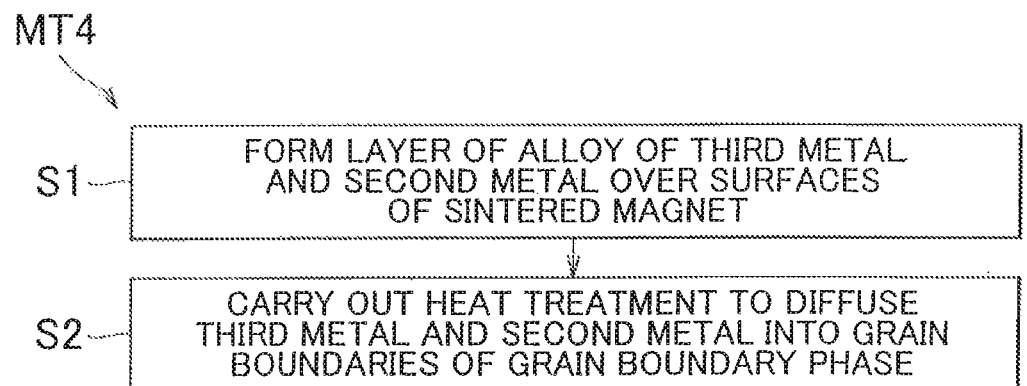
FIG. 5 is a flow chart of yet another embodiment of the method of producing a permanent magnet according to the present invention.

In addition, the production method MT4 shown in FIG. 5 includes depositing a layer of an alloy of yttrium (third metal) and dysprosium (second metal) over the surfaces of a neodymium sintered magnet (step S1), and performing a heat treatment to diffuse the alloy into the grain boundaries of the grain boundary phase (step S2).

In all of the above production methods, the yttrium substitutes for the neodymium oxide that is present in the grain boundary phase to form a yttrium oxide, which allows dysprosium to diffuse along the grain boundaries into the deep interior of the permanent magnet without substituting for the yttrium oxide.

Therefore, it is possible to obtain a permanent magnet in which neodymium in main phase regions adjacent to the grain boundary phase regions has been substituted by dysprosium to form a main phase substituted phase that has a strong anisotropic magnetic field from its surface layer to deep interior (central portion).

The residual magnetization and coercivity of sample permanent magnets produced through the methods of the present invention (Example 1 to Example 4) and sample permanent magnets produced through a conventional method (Comparative Example 1 to Comparative Example 4) were measured with a vibration sample magnetometer (VSM).

The sintered magnets of Example 1 to Example 4 and Comparative Examples 1 and 2 are rectangular $Nd_2Fe_{14}B$ magnets with dimensions of 5 mm×5 mm×5.5 mm (detailed metal composition is shown in Table 1 below) and was subjected to oil polishing before sputtering.

The sintered magnets of Comparative Examples 3 and 4 were produced according to JP-A-2002-190404, as described above, and are rectangular $Nd_2Fe_{14}B$ magnets having dimensions of 5 mm×5 mm×5.5 mm (detailed metal composition is shown in Table 2 below) and was subjected to oil polishing before sputtering.

TABLE 1

| Nd | Dy | Pr | B | Co | Al | Cu | O | Fe |
|---|---|---|---|---|---|---|---|---|
| 25.1 | 0.26 | 3.1 | 1.01 | 1.06 | 0.1 | 0.1 | 0.12 | Balance (% by mass) |

TABLE 2

| | Nd | Dy | Pr | Y | B | Co | Al | Cu | Fe |
|---|---|---|---|---|---|---|---|---|---|
| Comparative Example 3 | 22.93 | 0.26 | 3.1 | 2.1 | 1.02 | 1.07 | 0.1 | 0.1 | Balance (% by mass) |

TABLE 2-continued

|  | Nd | Dy | Pr | Y | B | Co | Al | Cu | Fe |
|---|---|---|---|---|---|---|---|---|---|
| Comparative Example 4 | 21.04 | 0.25 | 3.1 | 4 | 1.02 | 1.07 | 0.1 | 0.1 | Balance (% by mass) |

The permanent magnet of Example 1 was produced by the production method MT1, which is shown in FIG. 2. First, a layer of yttrium with a thickness of 3 μm was formed over the surfaces of the magnet by magnetron sputtering and the yttrium was diffused into the grain boundaries under the following heat treatment conditions to obtain an intermediate: introducing Ar under a vacuum atmosphere of $10^{-5}$ Pa until the pressure reached 1.33 kPa (10 Torr); increasing the temperature of the atmosphere to 850° C. in one hour; maintaining this state for five hours; and reducing the temperature to ambient temperature in 30 minutes.

Next, dysprosium was diffused into the grain boundaries in the intermediate by the following procedure: placing 20 g of dysprosium on the bottom of a vacuum furnace; placing the permanent magnet, in which yttrium had been diffused into the grain boundaries, on a wire net made of molybdenum that is provided above the dysprosium. The dysprosium is then diffused into the grain boundaries under the following furnace conditions for optimizing the heat treatment: increasing the temperature of the atmosphere to 850° C. in one hour under a vacuum atmosphere of $10^{-1}$ Pa; maintaining the pressure and temperature for 24 hours; reducing the temperature to ambient temperature in 30 minutes; and maintaining the temperature at 500° C. for one hour. Under these conditions, the dysprosium is sublimated and the furnace becomes filled with dysprosium vapor.

The permanent magnet of Example 2 was produced using the method MT2, shown in FIG. 3. First, an intermediate was obtained in the same manner as in Example 1. Then, the intermediate was washed with an acid, immersed in a 10% nitric acid solution for 3 minutes, and dried immediately.

Next, a 5 μm layer of dysprosium was deposited over the surfaces of the magnet by magnetron sputtering, and the dysprosium was diffused into the grain boundaries under the following heat treatment conditions for optimizing the heat treatment: introducing Ar under a vacuum atmosphere of $10^{-5}$ Pa until the pressure reached 1.33 kPa (10 Torr); increasing the temperature of the atmosphere to 850° C. in one hour; maintaining the pressure and temperature for 10 hours; reducing the temperature to ambient temperature in 30 minutes; and maintaining the temperature at 500° C. for one hour.

The permanent magnet of Example 3 was produced using the method MT3, shown in FIG. 4. First, a 3 μm layer of yttrium was deposited over the surfaces of the magnet by magnetron sputtering and a 5 μm layer of dysprosium was deposited over the yttrium layer, and the yttrium and dysprosium were diffused into the grain boundaries under the following heat treatment conditions for optimizing the heat treatment: introducing Ar under a vacuum atmosphere of $10^{-5}$ Pa until the pressure reached 1.33 kPa (10 Torr); increasing the temperature of the atmosphere to 850° C. in one hour; maintaining the pressure and temperature for 10 hours; reducing the temperature to ambient temperature in 30 minutes; and maintaining the temperature at 500° C. for one hour.

The permanent magnet of Example 4 was produced using the method MT4, which is shown in FIG. 5. First, a layer of a dysprosium –40 at. % yttrium alloy with a thickness of 8 μm was formed over the surfaces of the magnet by magnetron sputtering using the dysprosium –40 at. % yttrium alloy as a target, and the alloy was diffused into the grain boundaries under the following heat treatment conditions for optimizing the heat treatment: introducing Ar under a vacuum atmosphere of $10^{-5}$ Pa until the pressure reached 1.33 kPa (10 Torr); increasing the temperature of the atmosphere to 850° C. in one hour; maintaining the pressure and temperature for 10 hours; reducing the temperature to ambient temperature in 30 minutes; and maintaining the temperature at 500° C. for one hour.

The permanent magnet of Comparative Example 1 was produced using a method that was the same as the production method of Example 1 except that the steps for obtaining the intermediate were omitted. Specifically, dysprosium was diffused into grain boundaries of a permanent magnet into which yttrium had not been diffused under the same conditions as in Example 1.

The permanent magnet of Comparative Example 2 was produced using the same method as in Example 3 except that the step of forming a Y layer with a thickness of 3 μm over the surfaces of the magnet by magnetron sputtering was omitted.

The permanent magnets of Comparative Examples 3 and 4 were produced, using a sintered magnet that had a component composition that is shown in Table 2, by the same method as in Example 3 except that the step of forming a yttrium layer with a thickness of 3 μm over the surfaces of the magnet by magnetron sputtering was omitted.

The results of measurements that were made using a Vibration sample magnetometer (VSM) are summarized in Table 3 and FIGS. 6 and 7 below.

TABLE 3

|  | Residual magnetization Br (T) | | | Coercivity Hcj (kOe) | | |
|---|---|---|---|---|---|---|
|  | Before treatment | After diffusion of Dy | After diffusion of Dy | Before treatment | After diffusion of Y | After diffusion of Dy |
| Example 1 | 1.36 | 1.35 | 1.34 | 11.5 | 11 | 19.2 |
| Example 2 | 1.36 | 1.35 | 1.32 | 11.5 | 11 | 19.0 |
| Example 3 | 1.36 | 1.35 | 1.32 | 11.5 | 11 | 18.8 |
| Example 4 | 1.36 | 1.35 | 1.32 | 11.5 | 11 | 18.6 |
| Comparative Example 1 | 1.36 | — | 1.32 | 11.5 | — | 16.5 |
| Comparative Example 2 | 1.36 | — | 1.33 | 11.5 | — | 15.4 |
| Comparative Example 3 | 1.27 | — | 1.24 | 10.1 | — | 14.8 |
| Comparative Example 4 | 1.22 | — | 1.19 | 8.6 | — | 13.6 |

Figure 6:
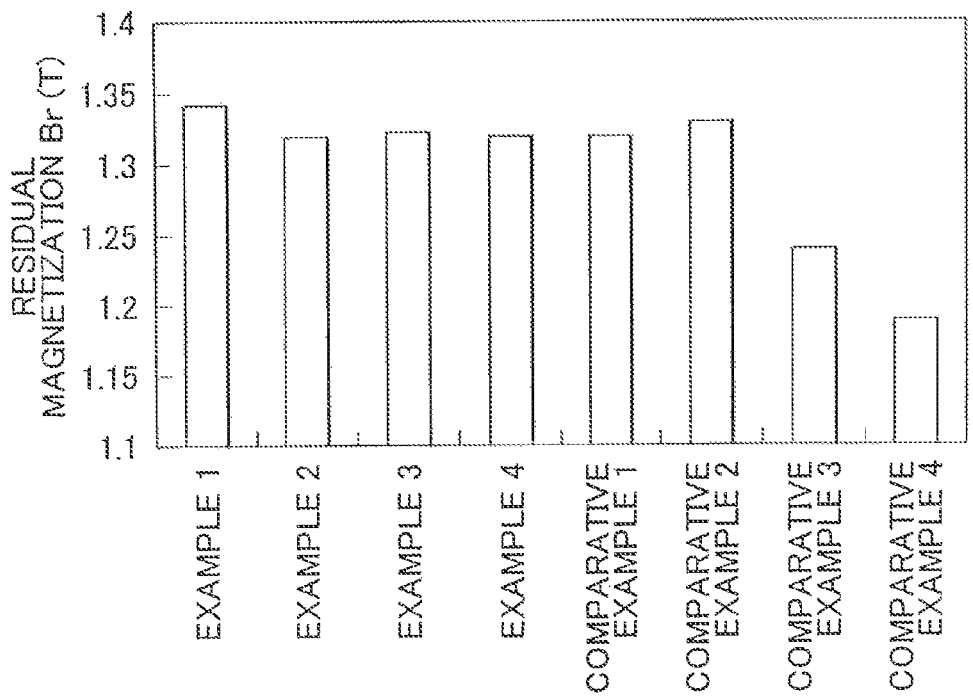
FIG. 6 is a graph that shows the result about residual magnetization of the results of measurements on the permanent magnets of Examples and Comparative Examples with a vibration sample magnetometer (VSM)
Figure 7:
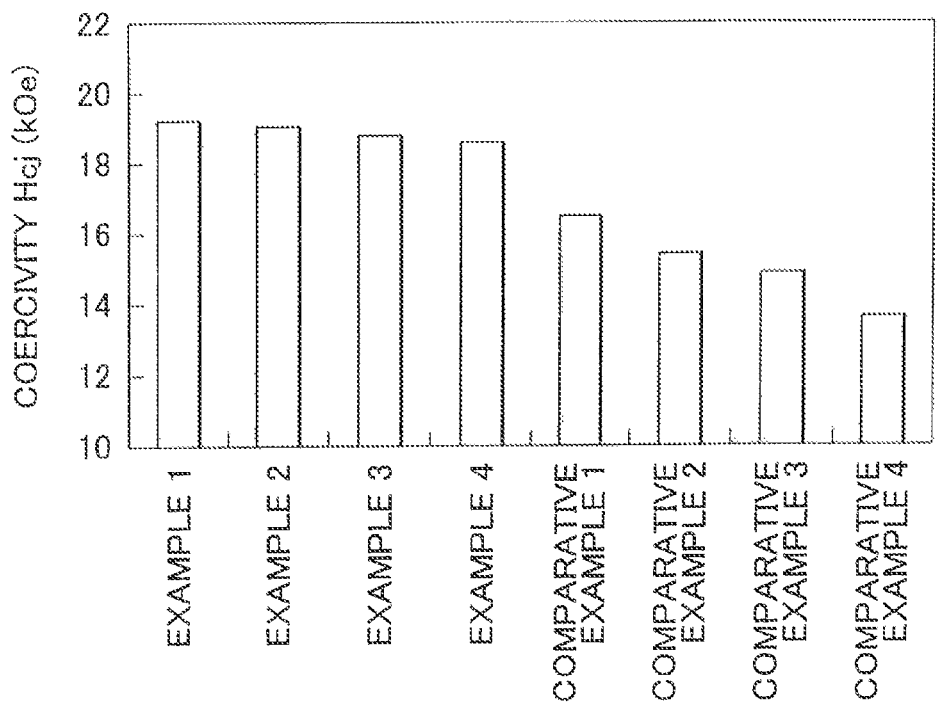
FIG. 7 is a graph that shows the coercivity of the permanent magnets of Examples and Comparative Examples measured with a vibration sample magnetometer (VSM)

Table 3 and FIGS. 6 and 7 indicate that the permanent magnet of Example 1 exhibited higher residual magnetization and coercivity than the permanent magnets of the other examples and comparative examples.

The properties of the permanent magnet of Example 1 are due to the reduced penetration of dysprosium into the main phase and the increased percentage of dysprosium that penetrates into the grain boundary phase that occur when dysprosium vapor is diffused into the grain boundaries from the surfaces of the intermediate.

In addition, the permanent magnets of Examples 1 to 4 had higher residual magnetization and showed a far lower rate of decrease from the value before treatment compared to the permanent magnet of Comparative Examples 1 to 4. In addition, the coercivity was improved by approximately 15 to 30%, which indicates diffusing yttrium, which has lower standard free energy of oxide formation than Nd and dysprosium, into the grain boundaries of the grain boundary phase is highly effective.

The amount of oxygen in permanent magnets was also varied to produce a permanent magnets of Example 1 as described above (amount of oxygen: 0.08% by mass) and permanent magnets of Examples 5 to 9, which were produced using the same method as in Example 1 but including difference concentrations of oxygen, and the coercivity of the permanent magnets was then measured. The results of measurements are summarized in Table 4 below and FIG. 8.

TABLE 4

|           | Amount of oxygen (% by mass) | Coercivity Hcj (kOe) |
|-----------|------------------------------|----------------------|
| Example 5 | 0.08                         | 19.8                 |
| Example 1 | 0.12                         | 19.4                 |
| Example 6 | 0.20                         | 19.3                 |
| Example 7 | 0.31                         | 18.1                 |
| Example 8 | 0.42                         | 17.9                 |
| Example 9 | 0.54                         | 17.7                 |

In the permanent magnet described in JP-A-2002-190404, oxygen drives the yttrium present in the main phase in advance into the grain boundary phase and the concentration of oxygen is set to 2000 ppm or higher. However, the permanent magnet and the method of producing the permanent magnet according to the present invention do not require oxygen in the permanent magnet.

Figure 8:
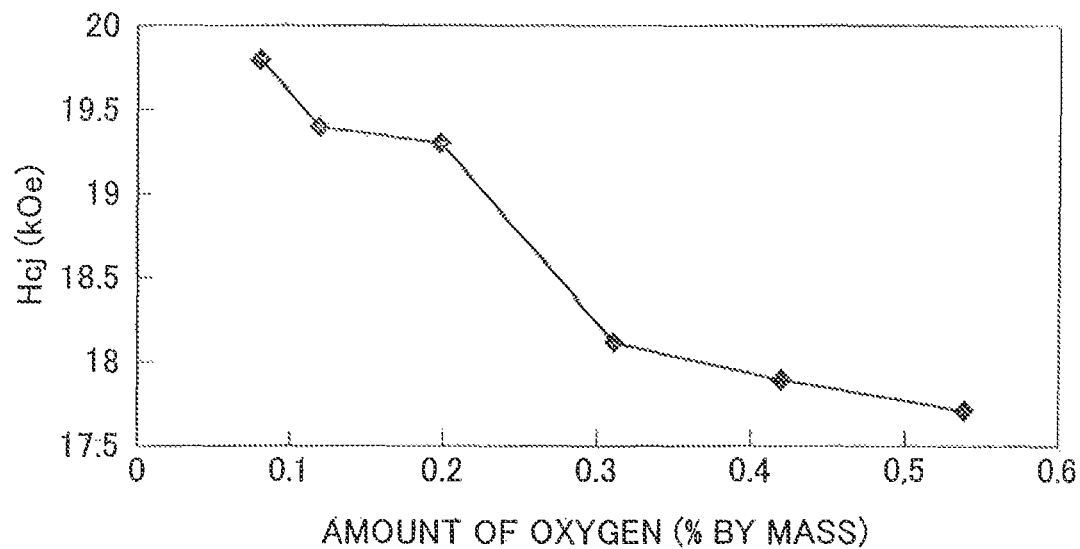
FIG. 8 is a graph that shows correlation between the amount of oxygen in a permanent magnet and coercivity.
Figure 9A:
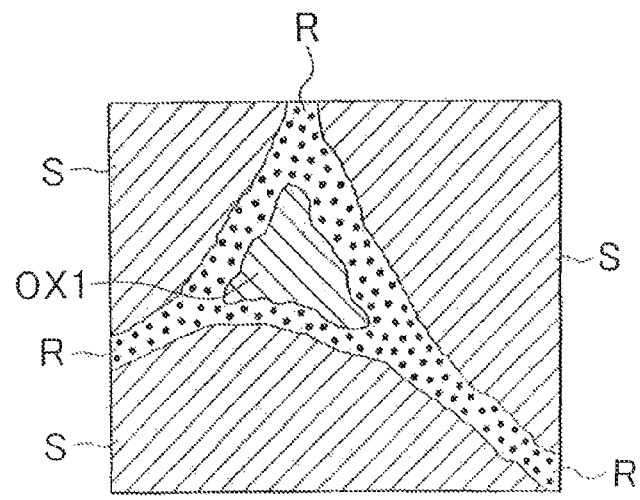
FIGS. 9A to 9C grain structure diagrams that sequentially illustrate the method of producing a permanent magnet according to a related art.
Figure 9B:
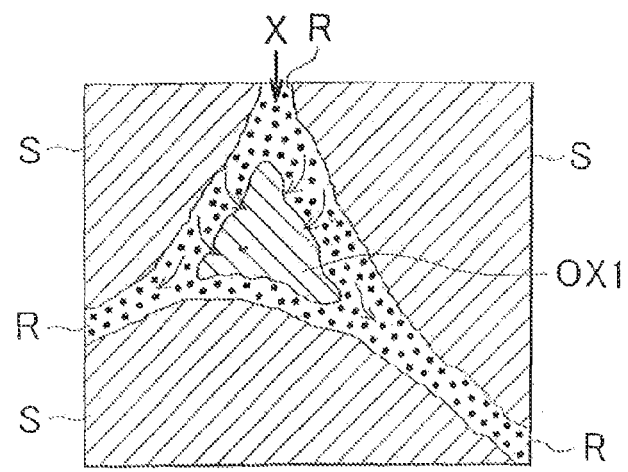
Figure 9C:
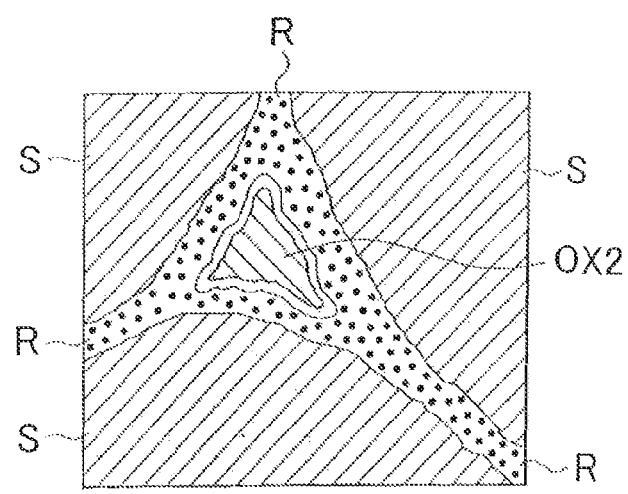

As is apparent from Table 4 and FIG. 8, if the amount of oxygen is large, the percentage of oxygen that cannot be fixed by yttrium increases, which leads to deterioration of coercivity.

The present inventors have found that it is preferred that the amount of oxygen in the permanent magnet is small and the amount of oxygen should be 2000 ppm or less to obtain a permanent magnet with high coercivity and good magnetizing properties.

While one embodiment of the prevent invention has been descried with reference to drawings, it should be noted that the specific configuration is not limited to the described embodiment and modifications may be made that remain within the scope of the present invention.

The invention claimed is:

1. A permanent magnet that has a grain structure that comprises a main phase and a grain boundary phase which is primarily composed of a first metal,
   the permanent magnet wherein
   a second metal that enhances the coercivity of the permanent magnet and a third metal that has a lower standard free energy of oxide formation than the first metal and the second metal are diffused in the permanent magnet, and
   the third metal is present in the form of an oxide in the grain boundary phase;
   wherein the second metal does not form an oxide;
   wherein the third metal is substantially not present in the main phase; and
   wherein the third metal oxide is present at triple points where three regions of the grain boundary phases meet.

2. The permanent magnet according to claim 1, wherein the first metal is neodymium or praseodymium.

3. The permanent magnet according to claim 2, wherein the second metal is any one of dysprosium, terbium or holmium, and the third metal is either yttrium or scandium.

4. A permanent magnet that has a grain structure that comprises a main phase and a grain boundary phase which is primarily composed of a first metal,
   the permanent magnet comprising:
   a second metal that enhances the coercivity of the permanent magnet; and
   a third metal that has a lower standard free energy of oxide formation than the first metal and the second metal, wherein:
   both densities of the second metal and the third metal are richer in the grain boundary phase than in the main phase; and
   the third metal is present in the form of an oxide in the grain boundary phase;
   wherein the second metal does not form an oxide;
   wherein the third metal is substantially not present in the main phase; and
   wherein the third metal oxide is present at triple points where three regions of the grain boundary phases meet.

5. A permanent magnet that has a grain structure composed of a main phase and a grain boundary phase, comprising:
   a first metal as a primary metal that composes the main phase;
   a second metal that is diffused in the permanent magnet and enhances coercivity of the permanent magnet; and
   a third metal, which is diffused in the permanent magnet and has a lower standard free energy of oxide formation than the first metal and the second metal,
   wherein
   the third metal is present in the form of an oxide in the grain boundary phase;
   wherein the second metal does not form an oxide;
   wherein the third metal is substantially not present in the main phase; and
   wherein the third metal oxide is present at triple points where three regions of the grain boundary phases meet.

* * * * *